(12) United States Patent
Shimura (10) Patent No.: US 9,425,205 B2
(45) Date of Patent: Aug. 23, 2016

(54) SEMICONDUCTOR MEMORY DEVICE (71) Applicant: Kabushiki Kaisha Toshiba, Minato-ku (JP)

(72) Inventor: Yasuhiro Shimura, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/631,022

(22) Filed: Feb. 25, 2015

(65) Prior Publication Data

US 2016/0079254 A1    Mar. 17, 2016

Related U.S. Application Data

(60) Provisional application No. 62/049,604, filed on Sep. 12, 2014.

(51) Int. Cl.
*H01L 27/115*    (2006.01)
*H01L 29/792*    (2006.01)

(52) U.S. Cl.
CPC .... *H01L 27/11568* (2013.01); *H01L 27/11582* (2013.01); *H01L 29/792* (2013.01)

(58) Field of Classification Search
CPC .................................................. H01L 29/7926
See application file for complete search history.

(56) References Cited

U.S. PATENT DOCUMENTS

| 8,258,033 | B2 | 9/2012 | Watanabe | |
|---|---|---|---|---|
| 8,274,108 | B2 | 9/2012 | Katsumata et al. | |
| 2009/0230449 | A1* | 9/2009 | Sakaguchi | H01L 27/0688 257/298 |
| 2011/0031550 | A1* | 2/2011 | Komori | H01L 27/11573 257/324 |
| 2011/0215394 | A1* | 9/2011 | Komori | H01L 29/792 257/324 |
| 2012/0068253 | A1* | 3/2012 | Oota | H01L 27/11578 257/324 |
| 2012/0112171 | A1* | 5/2012 | Hattori | H01L 27/1157 257/40 |
| 2012/0244673 | A1* | 9/2012 | Shinohara | H01L 27/1157 438/287 |

FOREIGN PATENT DOCUMENTS

JP    2014-053585 A    3/2014

* cited by examiner

*Primary Examiner* — Lex Malsawma
(74) *Attorney, Agent, or Firm* — Oblon, McClelland, Maier & Neustadt, L.L.P.

(57) ABSTRACT

According to one embodiment, a semiconductor memory device includes a stacked body; a semiconductor body; and a charge storage film. The stacked body includes a plurality of electrode layers crosswise extending in a first direction and second direction crossing the first direction, the plurality of electrode layers separately stacked each other in a third direction crossing the first direction and second direction. The semiconductor body extends in the third direction and provided in the stacked body. The charge storage film is provided between the semiconductor body and the plurality of electrode layers.

16 Claims, 11 Drawing Sheets

SEMICONDUCTOR MEMORY DEVICE

CROSS-REFERENCE TO RELATED APPLICATIONS

This application is based upon and claims the benefit of priority from U.S. Provisional Patent Application 62/049,604 field on Sep. 12, 2014; the entire contents of which are incorporated herein by reference.

FIELD

Embodiments described herein relate generally to a semiconductor memory device.

BACKGROUND

There has been proposed a memory device having a three-dimensional structure in which a memory hole is formed in a stacked body formed by stacking, via insulating layers, a plurality of electrode layers functioning as control gates in memory cells and a silicon body functioning as a channel is provided on the sidewall of the memory hole via a charge storage film.

A structure having a high aspect ratio is formed according to an increase in the number of stacked layers of the stacked body. Therefore, for example, there is concern about collapse of the stacked body.

DETAILED DESCRIPTION

According to one embodiment, a semiconductor memory device includes a stacked body; a semiconductor body; and a charge storage film. The stacked body includes a plurality of electrode layers crosswise extending in a first direction and second direction crossing the first direction, the plurality of electrode layers separately stacked each other in a third direction crossing the first direction and second direction. The semiconductor body extends in the third direction and provided in the stacked body. The charge storage film is provided between the semiconductor body and the plurality of electrode layers.

An embodiment is described with reference to the drawings. Note that, in the drawings, the same components are denoted by the same reference numerals and signs.

Figure 1:
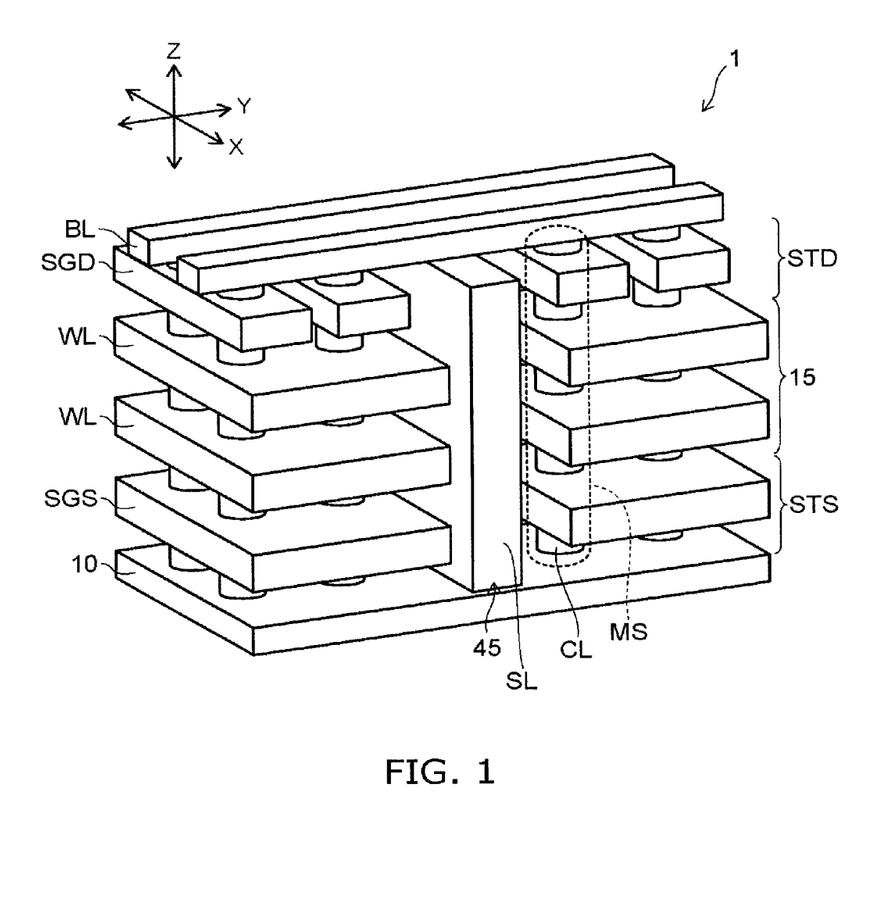
FIG. 1 is a schematic perspective view of a memory cell array of an embodiment.

FIG. 1 is a schematic perspective view of a memory cell array 1 of the embodiment. Note that, in FIG. 1, illustration of insulating layers and the like is omitted to clearly show the figure.

Figure 2:
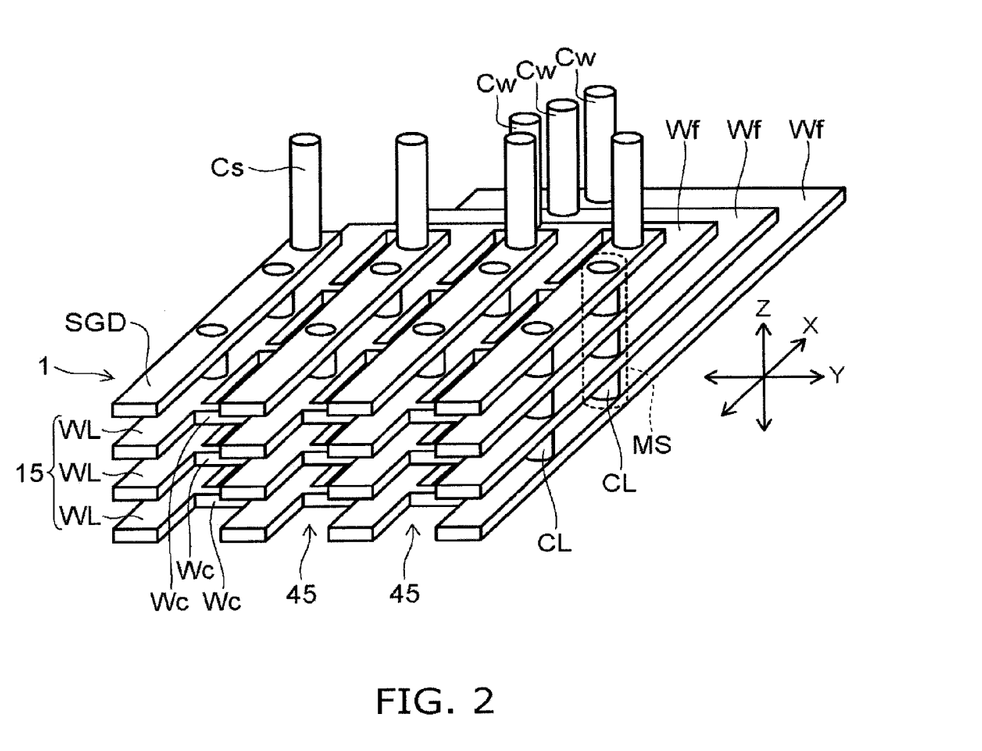
FIG. 2 is a schematic perspective view of a semiconductor memory device of the embodiment.

FIG. 2 is a schematic perspective view of a semiconductor memory device of the embodiment. In FIG. 2, as in FIG. 1, illustration of insulating layers and the like is omitted.

Figure 12A:
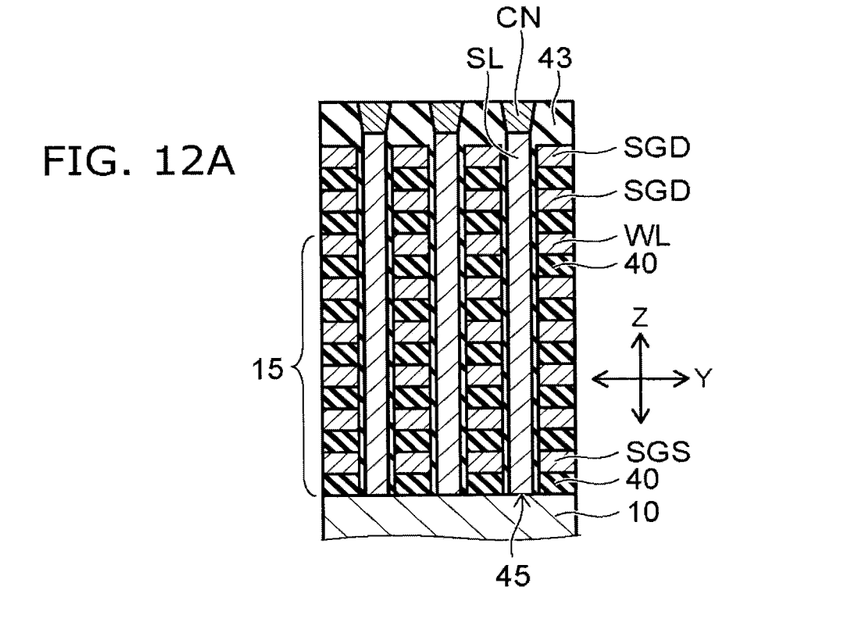
FIG. 12A and FIG. 12B are schematic sectional views the semiconductor memory device of the embodiment.
Figure 12B:
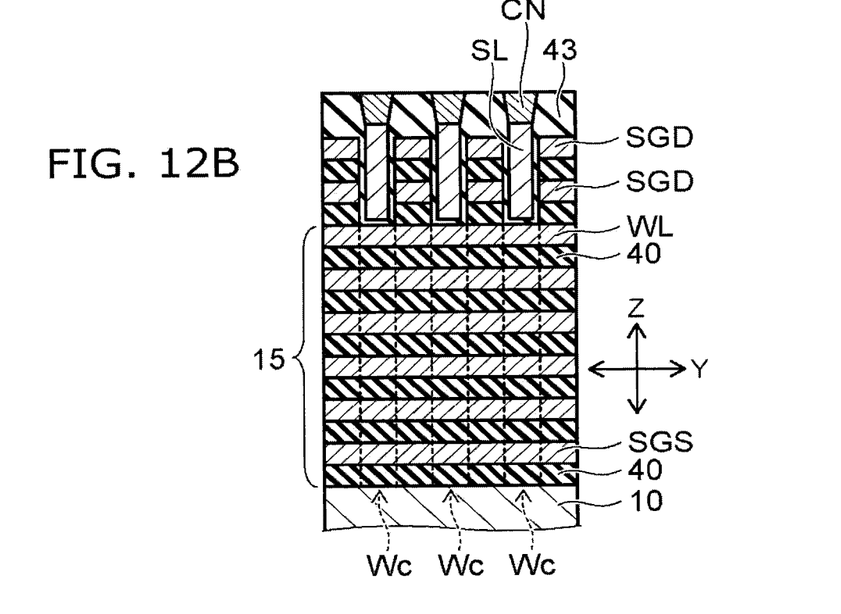

FIG. 12A and FIG. 12B are schematic sectional views the semiconductor memory device of the embodiment.

In FIG. 1 and FIG. 2, two directions parallel to the major surface of a conductive layer 10 and orthogonal to each other are represented as an X-direction (a first direction) and a Y-direction (a second direction). A direction orthogonal to both of the X-direction and the Y-direction is represented as a Z-direction (a third direction or a stacking direction).

As shown in FIG. 1 and FIG. 2, the memory cell array 1 includes a plurality of memory strings MS.

A source side selection gate SGS is provided on the conductive layer 10 (e.g., a substrate) via an insulating film. An insulating layer is provided on the source side selection gate SGS. On the insulating layer, a stacked body 15 formed by alternately stacking a plurality of electrode layers WL and a plurality of insulation layers 40 (FIG. 3) respectively one by one is provided. Note that the number of the electrode layers WL shown in the figure is an example. The number of the electrode layers WL may be any number.

An insulating layer (an interlayer insulating film) is provided on the top electrode layer WL. Drain side selection gates SGD are provided on the insulating layer.

The source side selection gate SGS, the drain side selection gates SGD, and the electrode layers WL are silicon layers containing silicon as a main component. For example, boron is doped in the silicon layers as impurities for imparting electric conductivity. The source side selection gate SGS, the drain side selection gates SGD, and the electrode layers WL may include a metal silicide (e.g., a tungsten silicide) or may include metal (e.g., tungsten or molybdenum). The insulating layers 40 mainly include, for example, a silicon oxide. The source side selection gate SGS, the drain side selection gates SGD, and the electrode layers WL may be metal (e.g., tungsten or molybdenum).

The thickness of the drain side selection gates SGD and the thickness of the source side selection gate SGS may be larger than the thickness of one electrode layer WL. A plurality of layers of the drain side selection gates SGD and the source side selection gate SGS may be provided. Note that the thickness of the source side selection gate SGS and the thickness of the drain side selection gates SGD may be the same as or smaller than the thickness of one electrode layer WL. In that case, as described above, a plurality of layers of the source side selection gate SGS and the the drain side selection gates SGD may be provided. Note that the "thickness" indicates the thickness in the stacking direction (the Z-direction) of the stacked body 15.

In the stacked body 15, a columnar section CL extending in the Z-direction is provided. The columnar section CL pierces through the drain side selection gate SGD, the stacked body 15, and the source side selection gate SGS. The columnar section CL is formed in, for example, a columnar or elliptical columnar shape. The columnar section CL is electrically connected to the conductive layer 10.

In the stacked body 15, a separating section 45 piercing through the drain side selection gate SGD, the stacked body 15, and the source side selection gate SGS is provided. A source layer SL is provided in the separating section 45 (insulating section). As shown in FIG. 12A and FIG. 12B, insulating films 43 (FIG. 6A) are provided between the source layer SL and the electrode layers WL. The side surfaces of the source layer SL are covered with the insulating films 43. As the source layer SL, a material having electric conductivity is used.

The lower end of the source layer SL is electrically connected to the columnar section CL via the conductive layer 10. The upper end of the source layer SL is electrically connected to a not-shown control circuit.

Figure 3:
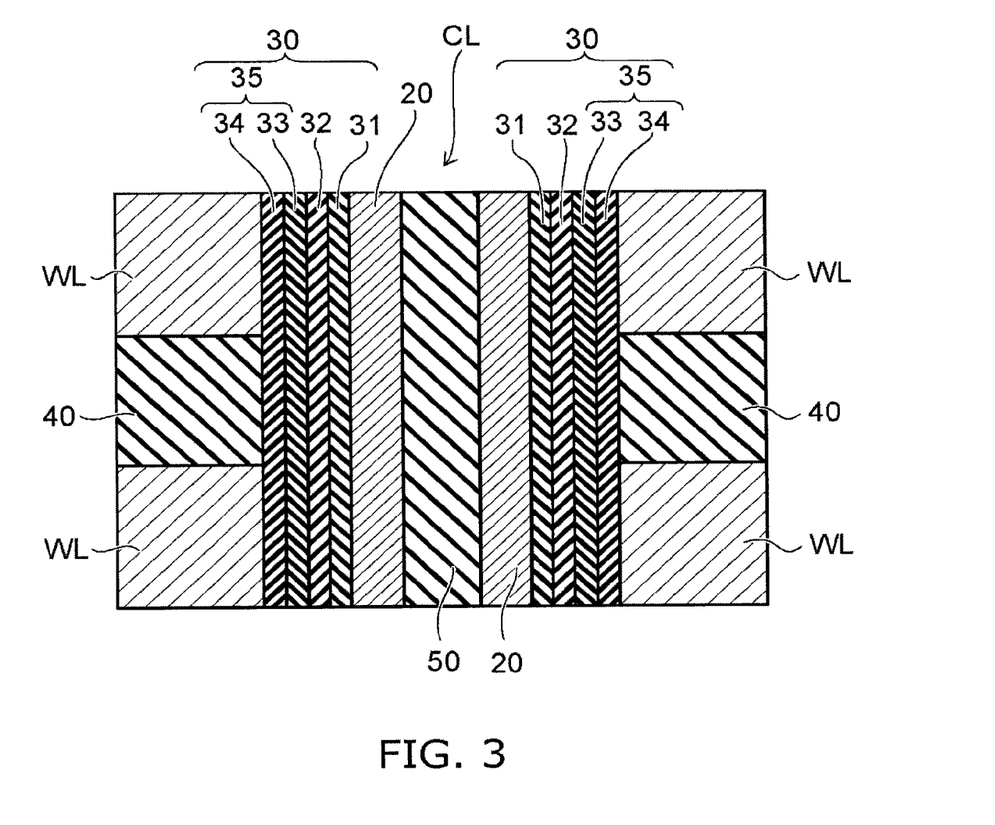
FIG. 3 is an enlarged schematic sectional view of a part of the columnar section of the embodiment.

FIG. 3 is an enlarged schematic sectional view of a part of the columnar section CL of the embodiment.

The columnar section CL is formed in a memory hole formed in the stacked body 15 including the plurality of electrode layers WL and the plurality of insulating layers 40. In the memory hole, a channel body 20 is provided as a semiconductor channel. The channel body 20 is a silicon film containing, for example, silicon as a main component. The impurity concentration of the channel body 20 is lower than, for example, the impurity concentration of the electrode layers WL.

The channel body 20 is provided to extend in the stacking direction of the stacked body 15. The upper end of the channel body 20 is connected to bit lines BL (interconnects) shown in FIG. 1. A part of the lower end side of the channel body 20 is connected to the conductive layer 10. The bit lines BL extend in the Y-axis direction and are separated from one another in the X-axis direction.

A memory film 30 is provided between the inner wall of the memory hole and the channel body 20. The memory film 30 includes a block insulating film 35, a charge storage film 32, and a tunnel insulating film 31. The memory film 30 is provided to extend in the stacking direction of the stacked body 15.

The block insulating film 35, the charge storage film 32, and the tunnel insulating film 31 are provided in order from the electrode layer WL side between the electrode layers WL and the channel body 20. The block insulating film 35 is in contact with the electrode layers WL. The tunnel insulating film 31 is in contact with the channel body 20. The charge storage film 32 is provided between the block insulating film 35 and the tunnel insulating film 31.

The channel body 20 is provided in a cylindrical shape extending in the stacking direction of the stacked body 15. The memory film 30 is provided in a cylindrical shape while extending in the stacking direction of the stacked body 15 to surround the outer circumferential surface of the channel body 20. The electrode layers WL surround the channel body 20 via the memory film 30. A core insulating film 50 is provided on the inner side of the channel body 20. The core insulating film 50 is, for example, a silicon oxide film.

The channel body 20 functions as a channel in the memory cells. The electrode layers WL function as control gates of the memory cells. The charge storage film 32 functions as a data storage layer that stores charges injected from the channel body 20. That is, memory cells having structure in which the control gates surround the channel are formed in crossing portions of the channel body 20 and the electrode layers WL.

The semiconductor memory device of the embodiment can electrically freely perform erasing and writing of data and can retain stored contents even if a power supply is turned off.

The memory cells are, for example, memory cells of a charge trap type. The charge storage film 32 includes a large number of trap sites that capture charges and is, for example, a silicon nitride film.

The tunnel insulating film 31 functions as a potential barrier when charges are injected into the charge storage film 32 from the channel body 20 or when the charges stored in the charge storage film 32 diffuse to the channel body 20. The tunnel insulating film 31 is, for example, a silicon oxide film.

As the tunnel insulating film 31, a stacked film (an ONO film) having structure in which a silicon nitride film is sandwiched by a pair of silicon oxide films may be used. When the ONO film is used as the tunnel insulating film 31, an erasing operation can be performed with a low electric field compared with a single layer of a silicon oxide film.

The block insulating film 35 prevents the charges stored in the charge storage film 32 from diffusing to the electrode layers WL. The block insulating film 35 includes a cap film 34 provided in contact with the electrode layers WL and a block film 33 provided between the cap film 34 and the charge storage film 32.

The block film 33 is, for example, a silicon oxide film. The cap film 34 is a film having a dielectric constant higher than the dielectric constant of silicon oxide. The cap film 34 is, for example, a silicon nitride film, an aluminum oxide film, a hafnium oxide film, or an yttrium oxide film. By providing such a cap film 34 in contact with the electrode layers WL, it is possible to suppress back tunnel electrons injected from the electrode layers WL during erasing. That is, by using a stacked film of the silicon oxide film and the silicon nitride film as the block insulating film 35, it is possible to improve charge blocking properties.

As shown in FIG. 1, a drain side selection transistor STD is provided in the upper end section of the columnar section CL in the memory string MS. A source side selection transistor STS is provided on the lower end section of the columnar section CL.

The memory cells, the drain side selection transistor STD, and the source side selection transistor STS are vertical transistors in which an electric current flows in the stacking direction (the Z-direction) of the stacked body 15.

The drain side selection gates SGD function as gate electrodes (control gates) of the drain side selection transistor STD. An insulating film functioning as a gate insulation film of the drain side selection transistor STD is provided between the drain side selection gates SGD and the channel body 20.

The source side selection gate SGS functions as a gate electrode (a control gate) of the source side selection transistor STS. An insulating film functioning as a gate insulating film of the source side selection transistor STS is provided between the source side selection gate SGS and the channel body 20.

A plurality of memory cells including the respective electrode layers WL as control gates are provided between the drain side selection transistor STD and the source side selection transistor STS.

The plurality of memory cells, the drain side selection transistor STD, and the source side selection transistor STS are connected in series through the channel body 20 and configure one memory string MS. The plurality of memory strings MS are arrayed in the X-direction and the Y-direction, whereby the plurality of memory cells are three-dimensionally provided in the X-direction, the Y-direction, and the Z-direction.

Figure 4A:
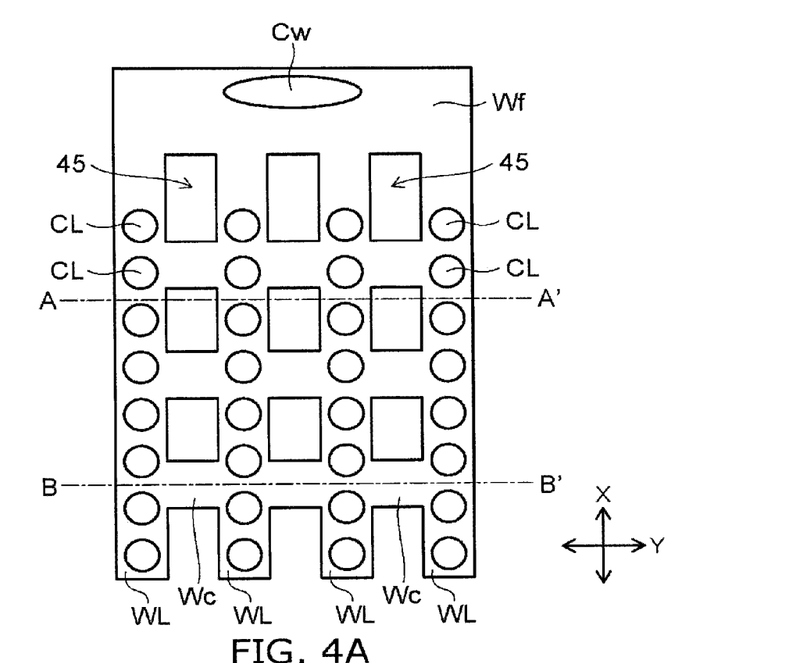
FIG. 4A is a schematic plan view of the semiconductor memory device of the embodiment.
Figure 4B:
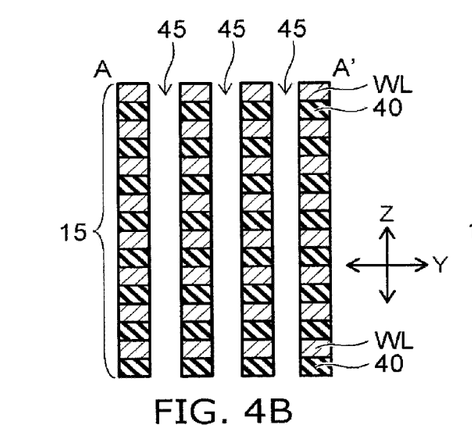
FIG. 4B and FIG. 4C are schematic sectional views the semiconductor memory device of the embodiment.
Figure 4C:
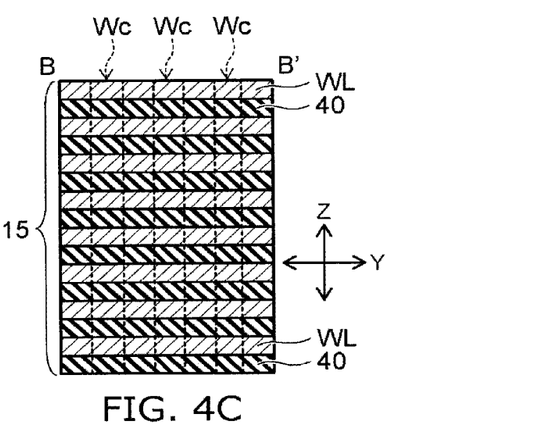

FIG. 4A is a schematic plan view of the semiconductor memory device of the embodiment. FIG. 4B and FIG. 4C are schematic sectional views the semiconductor memory device of the embodiment. Note that, in FIG. 4A to FIG. 4C, sections above and below the stacked body 15 are not shown.

FIG. 4B shows an A-A' cross section in FIG. 4A. FIG. 4C shows a B-B' cross section in FIG. 4A.

As shown in FIG. 2 and FIG. 4A, in the memory cell array 1, the separating sections 45 piercing through the drain side selection gates SGD and the stacked body 15 are provided. The drain side selection gates SGD are separated in the Y-axis direction via the separating sections 45. The separating sections 45 extend in the X-axis direction among the separated drain side selection gates SGD.

The electrode layers WL crosswise extend in the X-axis direction and the Y-axis direction. The electrode layers WL are separately stacked each other in Z-axis direction. The separating section 45 is provided between the plurality of intersection parts (intermediate section Wc) and extends Z-axis direction.

The stacked body 15 includes drawn-out sections Wf (connecting sections) and intermediate sections Wc (second portions). The drawn-out sections Wf extend in the Y-axis direction. The respective electrode layers WL extending in the X-axis direction are integrally provided via the drawn-out sections Wf.

The intermediate sections Wc are provided among the respective electrode layers WL separated in the Y-axis direction and are connected to the electrode layers WL. The intermediate sections Wc are separated in the X-axis direction via the separating sections 45 and are not connected to the source layer SL provided in the separating sections 45. Note that an interval and the number of the intermediate sections Wc provided in the X-axis direction may be any interval and any number.

The separating sections 45 are separated in the X-axis direction via the intermediate sections Wc among the separated electrode layers WL. That is, the separating sections 45 are provided in regions of the stacked body 15 where the intermediate sections Wc are not provided. The separating sections 45 and the intermediate sections Wc are alternately arranged in the X-axis direction.

The columnar sections CL are provided on the electrode layers WL and are not provided on the drawn-out sections Wf and the intermediate sections Wc. The number of the columnar sections CL provided in the X-axis direction and the Y-axis direction on the electrode layers WL may be any number.

As shown in FIG. 4B, in the regions where the intermediate sections Wc are not provided, the respective electrode layers WL are provided to be separated in the Y-axis direction via the separating sections 45.

As shown in FIG. 4C, in the regions where the intermediate sections Wc are provided, the respective electrode layers WL are integrally provided via the intermediate sections Wc.

For example, as a manufacturing method for the semiconductor memory device, grooves piercing through the stacked body 15 in the Z-axis direction are formed and the insulating films 43 and the source layer SL are embedded inside the grooves to form the separating sections 45. When the grooves are formed, for example, cleaning of the stacked body 15, metal replacement of the electrode layers WL, and the like are carried out. In this case, the stacked body 15 separated by the grooves collapses with, for example, stress. As the number of stacked layers increases, an aspect ratio of the grooves increases. The stacked body 15 is more likely to collapse.

On the other hand, according to the embodiment, the intermediate sections Wc are provided. Consequently, it is possible to prevent the collapse of the electrode layers WL even in a structure having a high aspect ratio.

As shown in FIG. 4A, a contact section Cw electrically connected to the outside is provided in the drawn-out section Wf. The contact section Cw is electrically connected to the respective electrode layers WL integrally provided with the drawn-out section Wf.

Figure 5A:
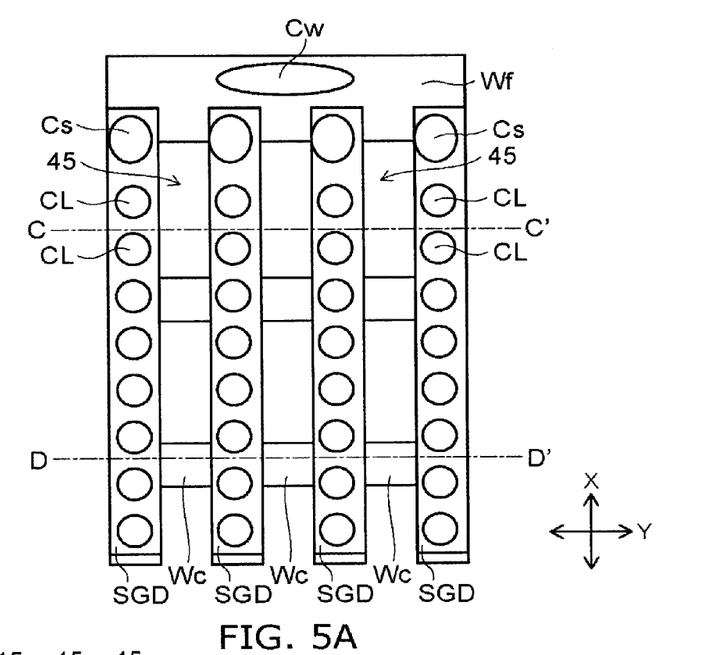
FIG. 5A is a schematic plan view of the semiconductor memory device of the embodiment.
Figure 5B:
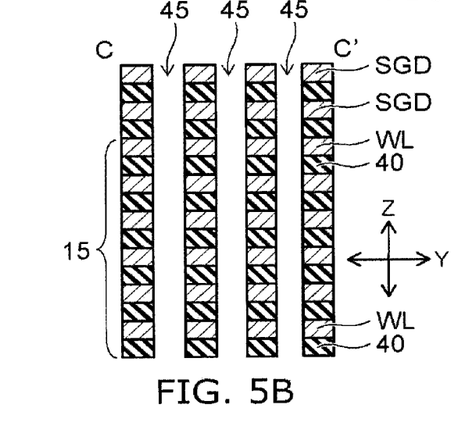
FIG. 5B and FIG. 5C are schematic sectional views the semiconductor memory device of the embodiment.
Figure 5C:
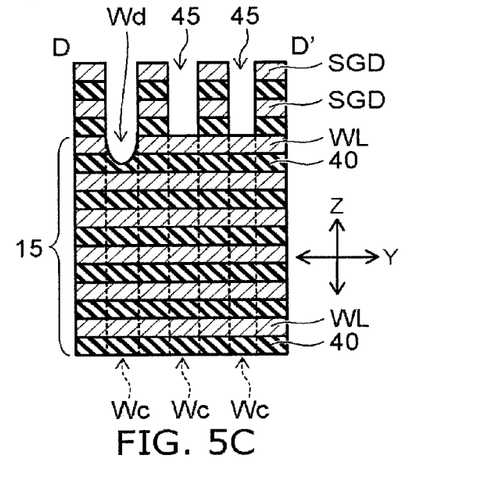

FIG. 5A is a schematic plan view of the semiconductor memory device of the embodiment. FIG. 5B and FIG. 5C are schematic sectional views of the semiconductor memory device of the embodiment. Note that, in FIG. 5A to FIG. 5C, illustration of sections above the drain side selection gates SGD and below the stacked body 15 is omitted.

FIG. 5B shows a C-C' cross section in FIG. 5A. FIG. 5C shows a D-D' cross section in FIG. 5A. As shown in FIGS. 5A to 5C, the drain side selection gates SGD are provided on the stacked body 15 via the insulating films 40 (the interlayer insulating film). In the drain side selection gates SGD, the drawn-out section Wf and the intermediate sections Wc are not provided. That is, unlike the electrode layers WL, the drain side selection gates SGD are completely separated in the Y-axis direction via the separating sections 45.

In the drain side selection gates SGD, contact sections Cs electrically connected to the outside are provided. The contact sections Cs are provided in the respective drain side selection gates SGD separated in the Y-axis direction. That is, the respective drain side selection gates SGD are independently controlled.

As shown in FIG. 5B, the separating sections 45 are integrally provided piercing through the drain side selection gates SGD and the stacked body 15. The drain side selection gates SGD include, for example, gate layers in which a plurality of selection gates are stacked in the stacking direction via the insulating layers 40. In this case, for example, the drain side selection gates SGD in the stacking direction are electrically connected to one another.

As shown in FIG. 5C, the intermediate sections Wc are not provided on the stacked body 15. For example, in an upper layer of the stacked body 15, a portion Wd formed by cutting a part of an upper layer of the intermediate section Wc may be provided. In this case, as in the case described above, it is possible to prevent the collapse of the stacked body 15.

Figure 6A:
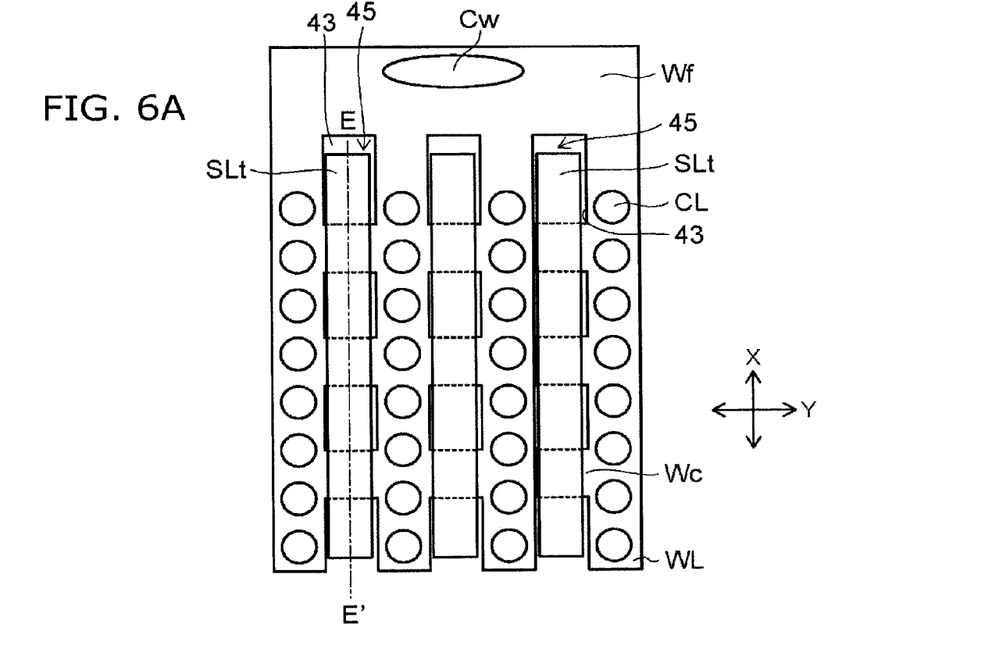
FIG. 6A is a schematic plan view of the semiconductor memory device of the embodiment.
Figure 6B:
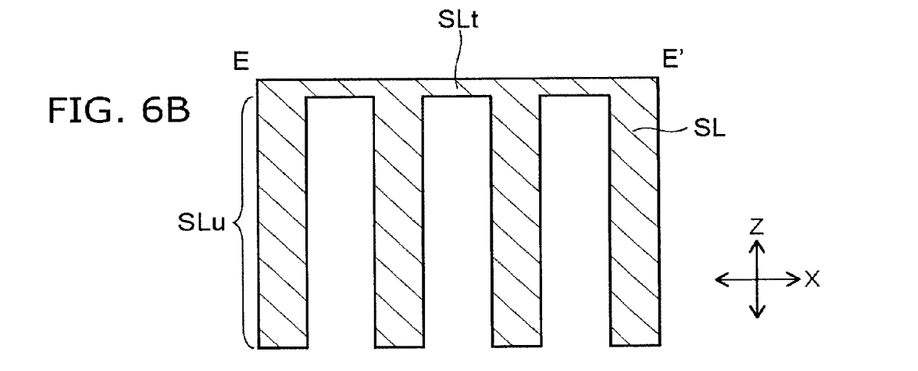
FIG. 6B is schematic sectional view the semiconductor memory device of the embodiment.

FIG. 6A is a schematic plan view of the semiconductor memory device of the embodiment. FIG. 6B is a schematic sectional view of the semiconductor memory device of the embodiment. Note that, in FIG. 6A and FIG. 6B, illustration of sections above and below the stacked body is omitted.

FIG. 6B shows an E-E' cross section in FIG. 6A.

As shown in FIG. 6A and FIG. 6B, upper sections SLt of the source layer SL provided in the separating sections 45 extend in the X-axis direction. The upper sections SLt are provided adjacent to the drain side selection gates SGD.

Lower sections SLu of the source layer SL extend in the stacking direction. The lower sections SLu are separated in the X-axis direction via the intermediate sections Wc. The lower sections SLu and the intermediate sections Wc are alternately arranged in the X-axis direction.

The lower sections SLu separated in the X-axis direction are integrally provided with the upper sections SLt (coupling sections). That is, the source layer SL is provided in a comb shape and separated in the Y-axis direction.

The insulating films 43 are provided between the stacked body 15 and the drain side selection gates SGD and the source layer SL. Consequently, the electrode layers WL, the intermediate sections Cw, and the drain side selection gates SGD are separated from the source layer SL.

Figure 7A:
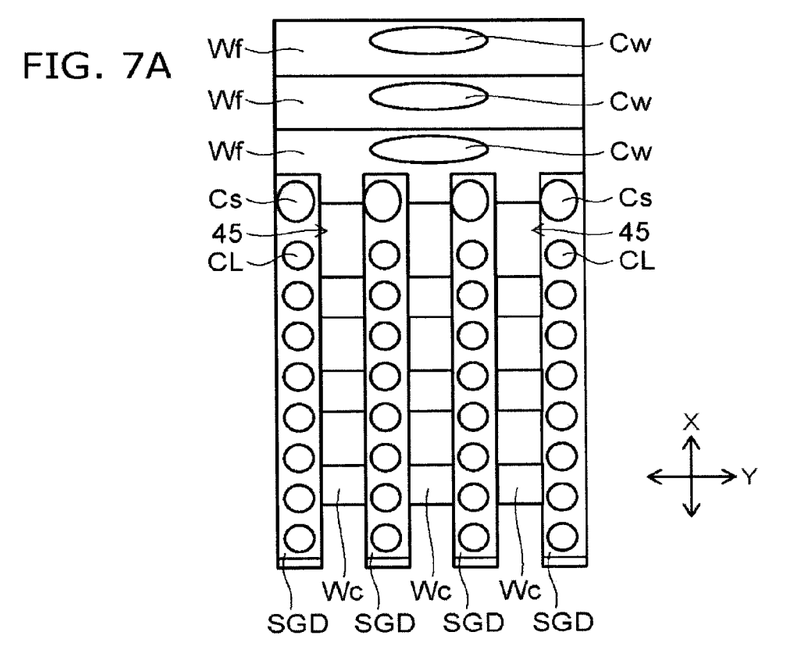
FIG. 7A is a schematic plan view of the semiconductor memory device of the embodiment.
Figure 7B:
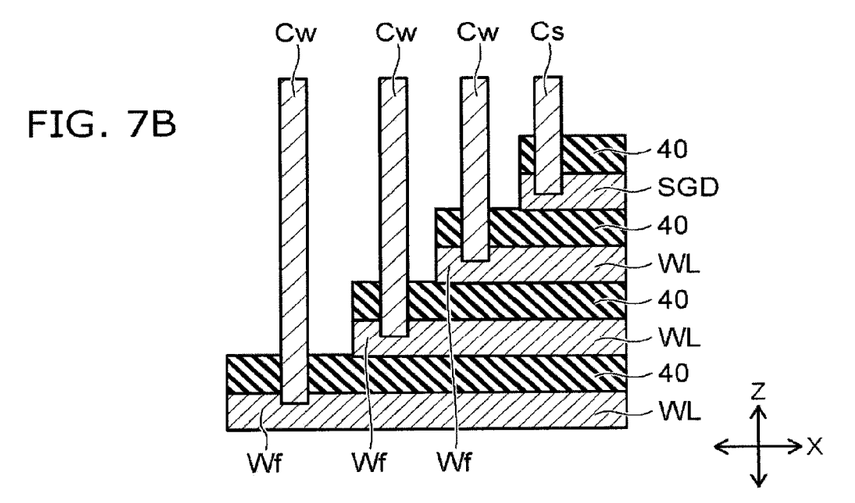
FIG. 7B is schematic sectional view the semiconductor memory device of the embodiment.

FIG. 7A is a schematic plan view of the semiconductor memory device of the embodiment. FIG. 7B is a schematic sectional view of the semiconductor memory device of the embodiment. Note that, in FIG. 7A and FIG. 7B, illustration of sections above the drain side selection gates SGD and below the stacked body 15 is omitted.

As shown in FIG. 7A and FIG. 7B, the drawn-out sections Wf of the respective layers are provided in a step shape with the upper surfaces thereof exposed without overlapping one another. The drawn-out section Wf of the bottom electrode layer WL is provided in a position more distant from the columnar sections CL than the drawn-out section Wf of the top electrode layer WL. The contact sections Cw are provided on the upper surfaces of the drawn-out sections Wf of the respective layers. The number of the contact sections Cw provided in the respective layers may be any number.

Figure 8:
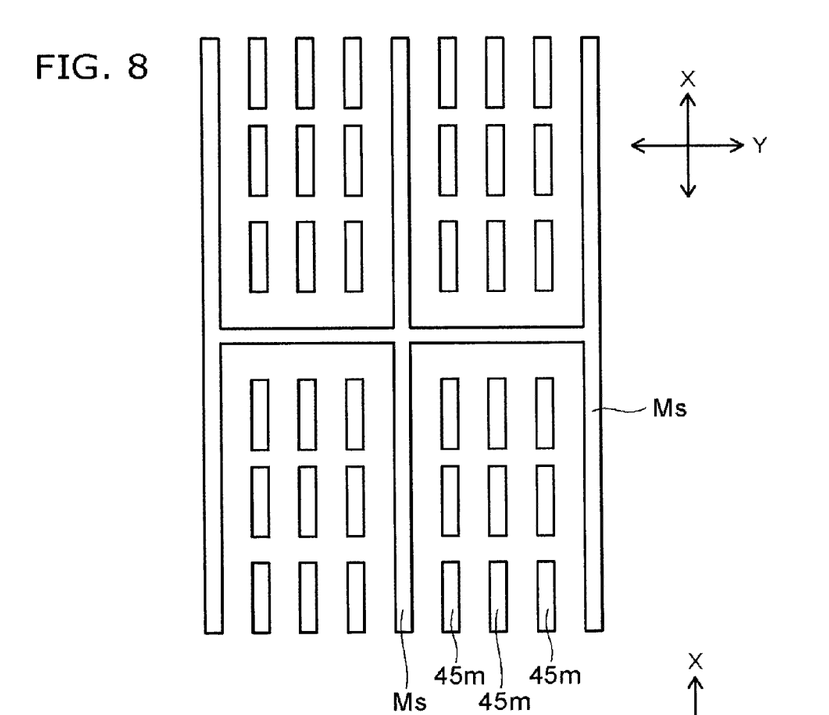
FIG. 8 is a plan view showing a slit pattern of the semiconductor memory device of the embodiment.

FIG. 8 is a plan view showing a slit pattern of the semiconductor memory device of the embodiment.

As shown in FIG. 8, the slit pattern of the embodiment includes groove patterns Ms indicating positions where insulating and separating sections are formed and separating section patterns 45m indicating positions where the separating sections 45 are formed.

The groove patterns Ms indicate positions where the insulating and separating sections for separating the stacked body 15 into a plurality of blocks are formed. The insulating and separating sections are provided among respective memory cell arrays.

The separating section patterns 45m are discontinuously provided in the X-axis direction. That is, in the stacked body 15, the separating sections 45 are discontinuously provided in the X-direction. The intermediate sections Wc are provided in portions sandwiched by the separating sections 45.

Figure 9:
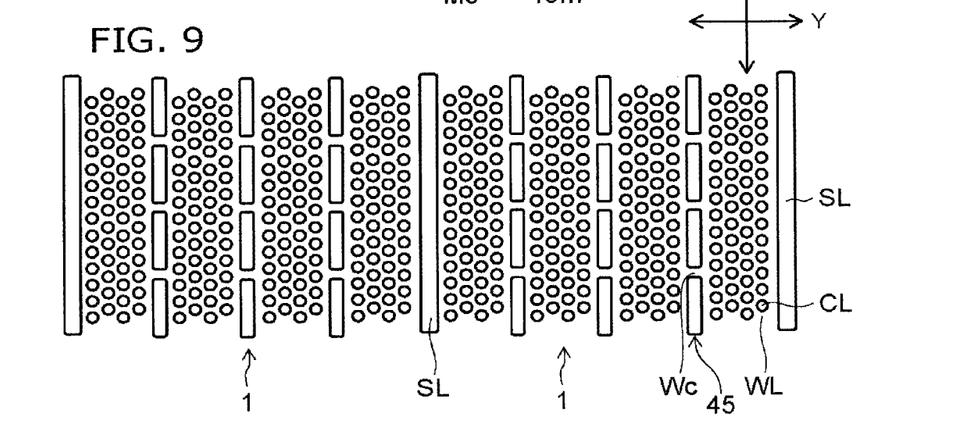
FIG. 9 is a schematic plan view of the semiconductor memory device of the embodiment.

FIG. 9 is a schematic plan view of the semiconductor memory device of the embodiment.

FIG. 9 shows a layout of the columnar sections CL provided in the memory cell array 1.

As shown in FIG. 9, the plurality of columnar sections CL are formed in, for example, the electrode layers WL separated via the separating sections 45. The width in the Y-axis direction of the electrode layer WL is larger than, for example, the width in the Y-axis direction of the intermediate sections Wc. The width in the Y-axis direction of the electrode layer WL extending the X-axis direction is larger than the width in the Y-axis of the separating section 45.

The plurality of columnar sections CL are provided in, for example, a zigzag shape. The number of the columnar sections CL provided in the separated electrode layers WL may be any number.

According to the embodiment, by providing the intermediate sections Wc, it is possible to prevent collapse of the electrode layers WL even in a structure having a high aspect ratio.

Figure 10:
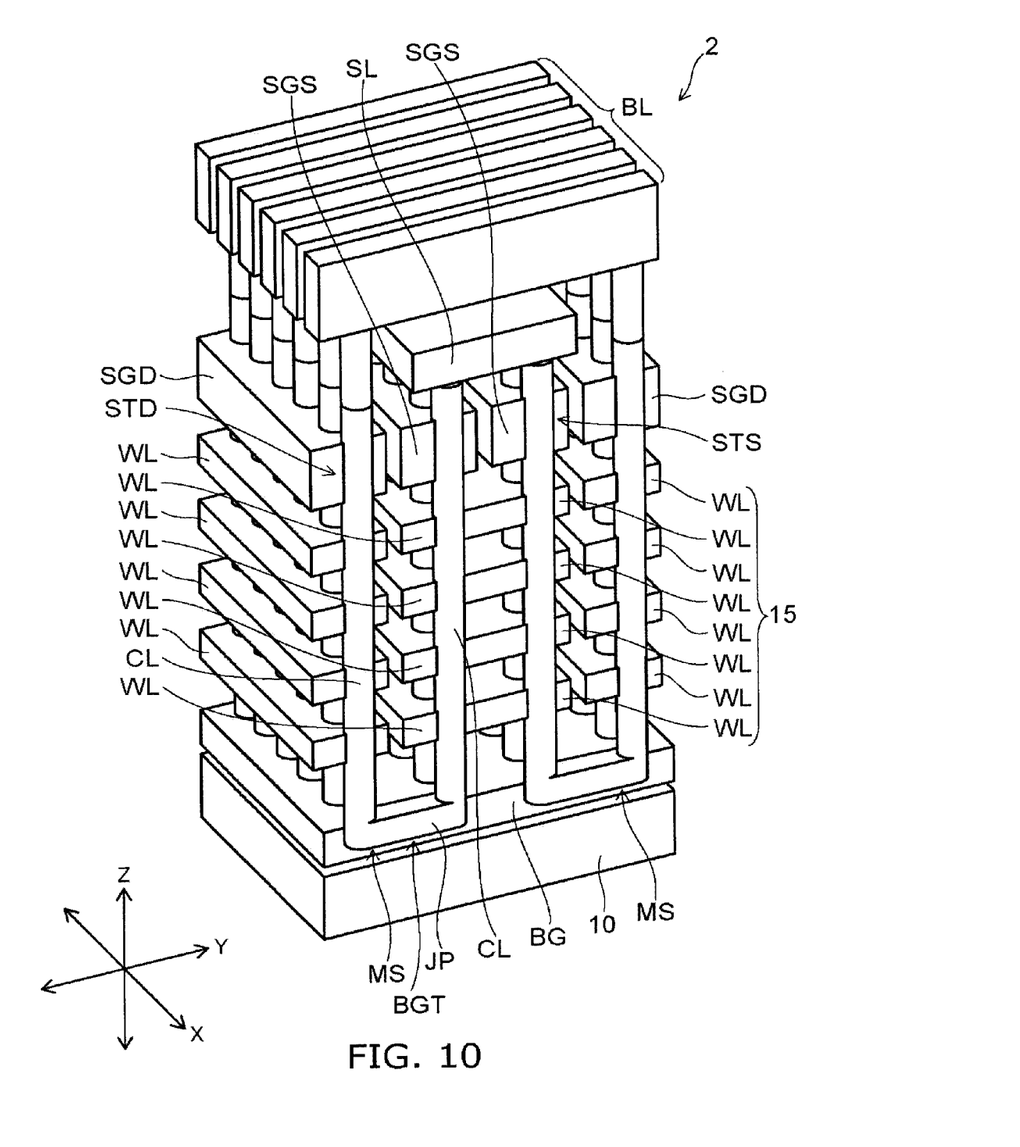
FIG. 10 is schematic perspective view of a memory cell array of another example of the semiconductor memory device of the embodiment.
Figure 11:
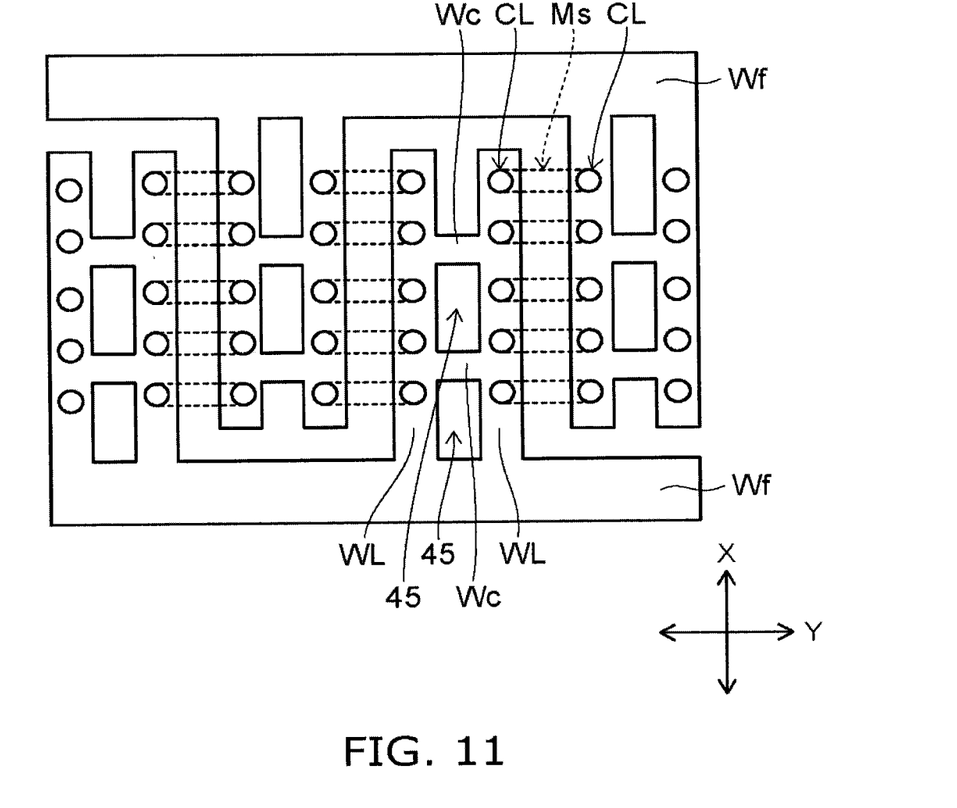
FIG. 11 is schematic plan view of a memory cell array of another example of the semiconductor memory device of the embodiment.

FIG. 10 and FIG. 11 are schematic views of a memory cell array of another example of the semiconductor memory device of the embodiment. FIG. 10 shows a schematic perspective view of a memory cell array 2. FIG. 11 is a schematic plan view of the memory cell array 2.

Note that, in FIG. 10, as in FIG. 1, illustration of insulating layers and the like is omitted to clearly show the figure. In FIG. 11, the top electrode layer WL of the stacked body 15 is illustrated.

A back gate BG is provided on the conductive layer 10 via an insulating layer. The stacked body 15 in which the plurality of electrode layers WL and the plurality of insulating layers 40 are alternately stacked is provided on the back gate BG.

One memory string MS is formed in a U shape including a pair of the columnar sections CL extending in the Z-direction and a coupling section JP that couples the lower ends of the pair of columnar sections CL. The columnar sections CL are formed in, for example, a columnar or elliptical columnar shape and pierce through the stacked body 15 to reach the back gate BG.

The drain side selection gate SGD is provided in the upper end section of one of the pair of columnar sections CL in the U-shaped memory string MS. The source side selection gate SGS is provided in the upper end section of the other. The drain side selection gate SGD and the source side selection gate SGS are provided on the top electrode layer WL via the insulating layer 40. The stacked body 15 includes the source side selection gate SGS, the drain side selection gate SGD, and a plurality of the electrode layers WL.

The drain side selection gates SGD and the source side selection gates SGS are separated in the Y-direction by the separating sections 45. The stacked body 15 including the drain side selection gates SGD and the stacked body 15 including the source side selection gates SGS are separated in the Y-direction by the separating sections 45. That is, the stacked body 15 between the pair of columnar sections CL of the memory string MS is separated by the separating section 45 in the Y-direction. The source layer SL is provided on the source side selection gates SGS via insulating layers. The plurality of bit lines BL are provided on the drain side selection gates SGD and the source layer SL via insulating layers. The bit lines BL extend in the Y-direction.

As shown in FIG. 11, the pair of electrode layers WL provided with the pair of columnar sections CL are provided to be connected to the drawn-out sections Wf different from each other. The intermediate sections Wc are integrally provided via the drawn-out sections Wf and provided between the pair of electrode layers WL adjacent to each other. On the other hand, the intermediate sections Wc are not provided between the pair of electrode layers WL in which the pair of columnar sections CL are provided. That is, the pair of electrode layers WL connected via the intermediate sections Wc form a pair. A plurality of the pairs are arrayed in the Y-axis direction. The intermediate sections Wc are not provided among the pairs.

When the memory cell array 2 is used, as in the memory cell array 1, by providing the intermediate sections Wc, it is possible to prevent collapse of the electrode layers WL even in a structure having a high aspect ratio.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor memory device comprising:
a stacked body including a plurality of electrode layers crosswise extending in a first direction and second direction crossing the first direction, the plurality of electrode layers separately stacked from each other in a third direction crossing the first direction and second direction, the plurality of electrode layers being separated from each other in the first direction by separating sections extending in the third direction, and being connected to each other by intermediate sections extending in the first and second directions;

a semiconductor body extending in the third direction and provided in the stacked body; and a charge storage film provided between the semiconductor body and the plurality of electrode layers.

2. The device according to claim 1, wherein
the semiconductor body and the charge storage film are provided in the plurality of electrode layers extending the first direction.

3. The device according to claim 1, further comprising a plurality of selection gates provided on the plurality of electrode layers, extending in the first direction, and separated in the second direction.

4. The device according to claim 3, wherein the plurality of selection gates includes a plurality of gate layers separately stacked each other in the third direction.

5. The device according to claim 3, wherein the semiconductor body and the charge storage film provided in the plurality of selection gates and extending the third direction.

6. The device according to claim 1, further comprising an insulating section provided between a plurality of intersection parts of the plurality of electrode layers and extending in the third direction.

7. The device according to claim 6, wherein the insulating section includes a source layer separated from the plurality of electrode layers.

8. The device according to claim 7, wherein the insulating section includes an insulating film provided between the source layer and the plurality of electrode layers.

9. The device according to claim 7, further comprising a conductive layer provided under the stacked body, wherein
a lower end of the semiconductor body and a lower end of the source layer are in contact with the conductive layer, and
the semiconductor body and the source layer are electrically connected via the conductive layer.

10. The device according to claim 7, wherein the source layer includes:
a plurality of lower sections extending in the third direction and provided between the plurality of intersection parts of the plurality of electrode layers; and
a coupling section extending in the first direction on the plurality of lower sections and connected to the plurality of lower sections.

11. The device according to claim 6, wherein a width in the second direction of the plurality of electrode layers extending the first direction is larger than a width in the second direction of the insulating section.

12. The device according to claim 1, wherein
a first pair and a second pair of a pair of the plurality of electrode layers extending in the first direction are separated each other.

13. The device according to claim 1, wherein the plurality of electrode layers in a same layer is connected to a connecting section provided in an end section in the first direction.

14. The device according to claim 13, wherein the connecting sections in layers are formed in a step shape.

15. The device according to claim 1, further comprising an insulating and separating section provided in the stack body, and separating the stacked body into a plurality of blocks in the first direction and the second direction.

16. The device according to claim 1, further comprising a plurality of bit lines provided on the stacked body, extending in the second direction, separated in the first direction, and connected to an upper end of the semiconductor body.

* * * * *